(12) United States Patent
Suzuki

(10) Patent No.: US 7,148,822 B2
(45) Date of Patent: Dec. 12, 2006

(54) DECODER AND DECODING METHOD

(75) Inventor: Kojiro Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/224,950

(22) Filed: Sep. 14, 2005

(65) Prior Publication Data

US 2006/0071830 A1 Apr. 6, 2006

(30) Foreign Application Priority Data

Sep. 15, 2004 (JP) ............... 2004-268486

(51) Int. Cl.
*H03M 7/40* (2006.01)
(52) U.S. Cl. ............... 341/67; 641/58; 641/65
(58) Field of Classification Search .......... 341/67, 341/65, 58
See application file for complete search history.

(56) References Cited

U.S. PATENT DOCUMENTS 5,032,838 A * 7/1991 Murayama et al. ......... 341/67
5,225,832 A * 7/1993 Wang et al. ............... 341/67
5,329,375 A * 7/1994 Juri et al. ................. 386/124
5,491,480 A * 2/1996 Jan et al. .................. 341/67
5,512,896 A * 4/1996 Read et al. ................ 341/65
6,054,942 A * 4/2000 Stemmler .................. 341/58
6,144,322 A * 11/2000 Sato ....................... 341/67
6,587,058 B1 * 7/2003 Deeley et al. ............. 341/67
6,850,648 B1    2/2005 Suzuki

FOREIGN PATENT DOCUMENTS

JP      8-275162     10/1996
JP      2003-111021  4/2003

* cited by examiner

*Primary Examiner*—Jean Bruner-Jeanglaude
(74) *Attorney, Agent, or Firm*—Oblon, Spivak, McClelland, Maier & Neustadt, P.C.

(57) ABSTRACT

A decoder configured to receive a variable length code stream packed in a fixed length area, and to execute variable length decoding and depacking of the variable length code stream, includes a first bit position table configured to store bit position data of the variable length code stream at a point where the variable length decoding is suspended. A bit length calculator is configured to calculate a bit length of variable length code stream remaining in the fixed length area after suspending the variable length decoding in the depacking, based on the bit position data.

20 Claims, 9 Drawing Sheets

AR4 FOURTH LUMINANCE AREA

AR5 FIRST CHROMINANCE AREA

AR6 SECOND CHROMINANCE AREA

|     |      | AR1 | AR2 | AR3 | AR4 | AR5 | AR6 |
|-----|------|-----|-----|-----|-----|-----|-----|
| (a) | ENDP | 112 | 224 | 336 | 448 | 528 | 608 |
| (b) | STRP | 109 | 187 | 326 | 443 | 509 | 594 |
| (c) | ENDF | 1   | 0   | 1   | 1   | 0   | 0   |
| (d) | EOBF | 0   | 1   | 0   | 0   | 1   | 1   |
| (e) | BLEN | 3   | 37  | 10  | 5   | 19  | 14  |

DECODER AND DECODING METHOD

CROSS REFERENCE TO RELATED APPLICATION AND INCORPORATION BY REFERENCE

This application is based upon and claims the benefit of priority from prior Japanese Patent Application P2004-268486 filed on Sep. 15, 2004; the entire contents of which are incorporated by reference herein.

BACKGROUND OF THE INVENTION

1. Field of the Invention

The present invention relates to a decoder and a decoding method for executing depacking and variable length decoding of a packed variable length code stream.

2. Description of the Related Art

In a digital video (DV) camera, a moving picture encoder encodes moving picture data so as to record the data on a recording medium, such as a magnetic tape. The encoding process executes a discrete cosine transform (DCT), quantization, and variable length encoding in this order. Since each sampling number of a luminance signal and a chrominance signal in a frame is different, the encoding process is executed for each macro-block including four luminance blocks and two chrominance blocks. With respect to a macro-block, after a variable length encoding, dispersion occurs in the bit length of each of the four luminance blocks in accordance with the complexity of a picture. Similarly, the dispersion of bit length occurs in the two chrominance blocks.

In the magnetic tape tracks for recording variable length encoded moving picture data (hereinafter referred to as "variable length code stream"), each track for recording the variable length code stream is divided into fixed length areas referred to as sync-blocks. Therefore, it is necessary to pack the variable length code stream of a variable length macro-block into a sync-block having a fixed length.

On the other hand, a depacking and variable length decoding are required so as to decode moving picture data from the packed variable length code stream. The packed variable length code stream is stored in a memory, and a variable length decoding is executed. A technique for reducing the capacity of the memory by increasing efficiency of the depacking and the variable length decoding has been proposed. A technique of further increasing efficiency of the depacking and the variable length decoding has also been proposed.

However, in the first and second techniques, it is difficult to improve the operational frequency of entire decoder because a controller in the decoder requires increased complexity. Especially, the circuit scale of the decoder increases because a subtractor having many bits is required for combining the variable length code stream in depacking. Furthermore, a delay time of the decoder increases because of a delay of carry transmission occurs due to the multi-bit subtractor having many bits. Although it is possible to reduce the delay time by utilizing a high performance subtractor, the circuit scale increases. As described above, a decoder capable of achieving both a decrease of the circuit scale and an increase of the operational frequency has been desired.

SUMMARY OF THE INVENTION

An aspect of the present invention inheres in a decoder configured to receive a variable length code stream packed in a fixed length area, and to execute variable length decoding and depacking of the variable length code stream encompassing, a first bit position table configured to store bit position data of the variable length code stream at a point where the variable length decoding is suspended, and a bit length calculator configured to calculate a bit length of variable length code stream remaining in the fixed length area after suspending the variable length decoding in the depacking, based on the bit position data.

Another aspect of the present invention inheres in a decoding method for executing variable length decoding and depacking of a variable length code stream packed in a fixed length area encompassing, storing bit position data of the variable length code stream at a point where the variable length decoding is suspended, and calculating a bit length of variable length code stream remaining in the fixed length area after suspending the variable length decoding in the depacking, based on the bit position data.

DETAILED DESCRIPTION OF THE INVENTION

Figure 1:
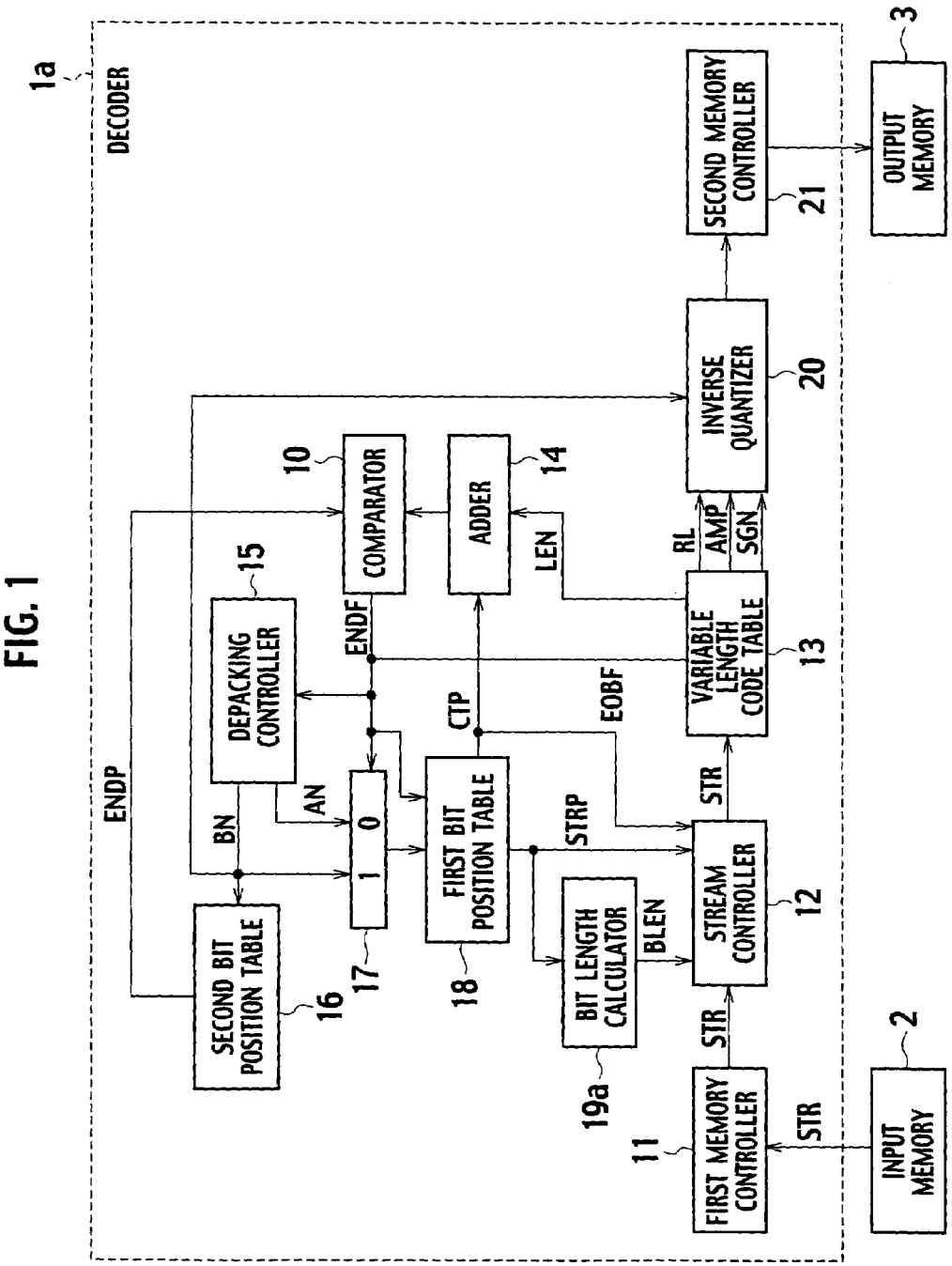
FIG. 1 is a block diagram showing a decoder according to an embodiment of the present invention.

Various embodiments of the present invention will be described with reference to the accompanying drawings. It is to be noted that the same or similar reference numerals are applied to the same or similar parts and elements throughout the drawings, and description of the same or similar parts and elements will be omitted or simplified. In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention with unnecessary detail. In the following description, the words "connect" or "connected" define a state in which first and second elements are electrically connected to each other without regard to whether or not there is a physical connection between the elements.

As shown in FIG. 1, a decoder 1a according to an embodiment of the present invention is connected between an input memory 2 and an output memory 3, for instance. The input memory 2 stores an encoded and packed variable length code stream STR that conforms to the DV format, such as the digital videocassette recorder for consumer use (DVC). The term "packing" refers to a process of cutting the variable length code stream STR beyond a fixed length area, and of storing the cut variable length code stream STR in another fixed length area having a storage capacity, so as to store the variable length code stream having a different bit length different in each block of the fixed length area. The decoder 1a receives the variable length code stream STR, and executes the variable length decoding and the depacking. The term "depacking" refers to a process of extracting and combining the variable length code stream STR, separately recorded in a plurality of fixed length areas. The decoder 1a includes a first bit position table 18 configured to store bit position data STRP of the variable length code stream STR at the point where the variable length decoding is suspended, and a bit length calculator 19a configured to calculate bit length BLEN of the variable length code stream STR remaining in the fixed length area after suspending the variable length decoding in the depacking. Operation of the bit length calculator 19a is based on the bit position data STRP. The "fixed length area" refers to a sync-block area corresponding to luminance blocks and chrominance blocks of a macro-block. In a sync-block, each of first to fourth luminance areas AR1 to AR4, and first and second chrominance areas AR5 and AR6, shown in FIG. 2 to FIG. 7, is the "fixed length area".

Figure 2:
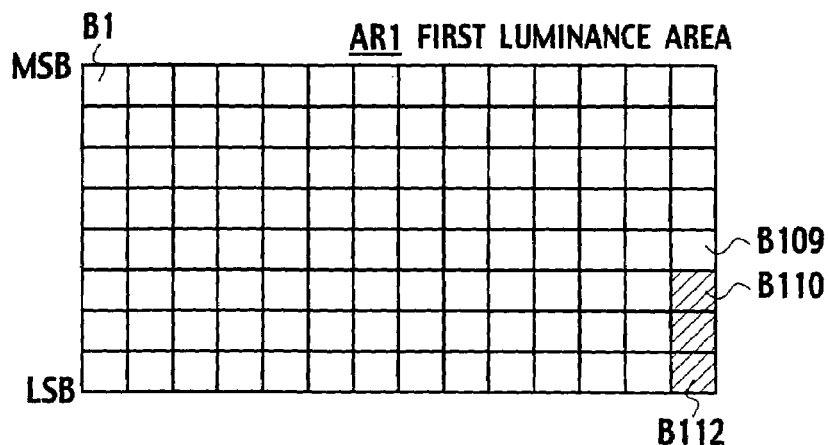
FIG. 2 is a schematic diagram showing a data arrangement example of a first luminance area according to the embodiment of the present invention.

The input memory stores the variable length code stream STR of a video segment, i.e. five sync-blocks. As shown in FIG. 2, the first luminance area AR1 has a fixed length area of 112 bits from B1 to B112. Similarly, each of the second to fourth luminance areas AR2 to AR4 has a fixed length area of 112 bits, as shown in FIG. 2 to FIG. 5.

Figure 6:
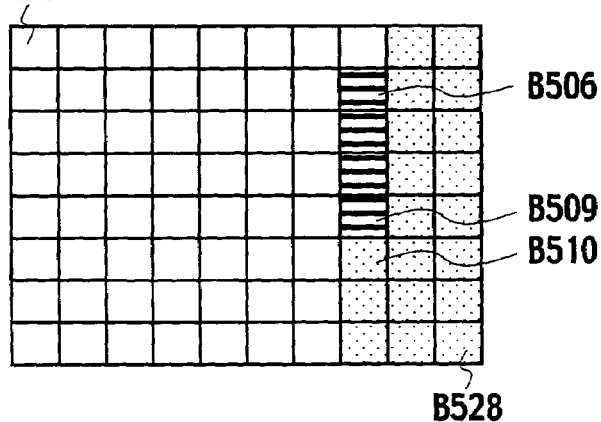
FIG. 6 is a schematic diagram showing a data arrangement example of a first chrominance area according to the embodiment of the present invention.
Figure 7:
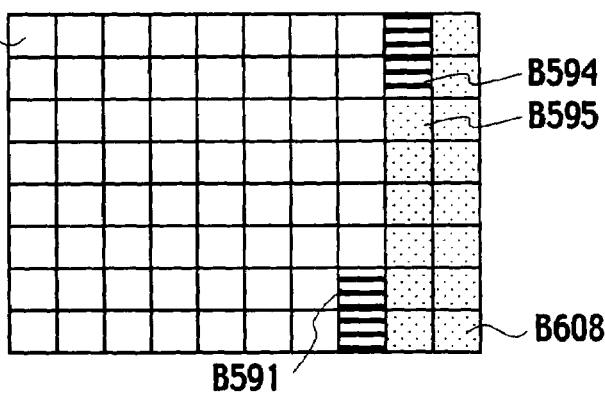
FIG. 7 is a schematic diagram showing a data arrangement example of a second chrominance area according to the embodiment of the present invention.

On the other hand, the first chrominance area AR5 has a fixed length area of 80 bits from B449 to B528, as shown in FIG. 6. Similarly, the second chrominance area AR6 has a fixed length are of 80 bits, as shown in FIG. 7.

The decoder 1a shown in FIG. 1 further includes a second bit position table 16 configured to store end bit position data ENDP of the fixed length area. The bit length of the variable length code stream STR of five sync-blocks, i.e., a video segment stored in the input memory 2, is about 3200 bits.

Each of the first and second bit position tables 18 and 16 has a bit width of 12 bits because the bit length of 3200 bits is represented by binary numbers.

The decoder 1a further includes a first memory controller 11, a stream controller 12, a variable length code table 13, an adder 14, a depacking controller 15, a selector 17, a comparator 10, an inverse quantizer 20, and a second memory controller 21. The first memory controller 11, the stream controller 12, the variable length code table 13, the inverse quantizer 20, and the second memory controller 21 are connected in series between the input memory 2 and the output memory 3. A Huffman table can be utilized as the variable length code table 13, for instance.

An input of the adder 14 is connected to each output of the first bit position table 18 and the variable length code table 13. An input of the comparator 10 is connected to each output of the adder 14 and the second bit position table 16. An input of the depacking controller 15 is connected to each output of the comparator 10 and the variable length code table 13. An input of the selector 17 is connected to each output of the depacking controller 15, the comparator 10, and the variable length code table 13.

The first memory controller 11 is controlled by the stream controller 12, and reads out the variable length code stream STR from the input memory 2. The stream controller 12 transmits the variable length code stream STR from the first memory controller 11 to the variable length code table 13 in accordance with a stream control data CTP generated by the first bit position table 18. The variable length code table 13 executes the variable length decoding to the variable length code stream STR transmitted by the stream controller 12.

As a result, sets of a zero run length RL, the amplitude of a coefficient value AMP, and the sign of the coefficient value SGN is generated. The variable length code table 13 supplies the code length data LEN of each variable length code to the adder 14. The inverse quantizer 20 executes an inverse quantization of the sets of the zero run length RL, the amplitude of the coefficient value AMP, and the sign of the coefficient value SGN, and rearranges the sets of the zero run length RL, the amplitude of the coefficient value AMP, and the sign of the coefficient value SGN in the form of zigzag scan. The output data of the inverse quantizer 20 is written in the output memory 3 via the second memory controller 21.

The adder 14 adds the stream control data CTP generated by the first bit position table 18 and the code length data LEN generated by the variable length code table 13. The comparator 10 compares an addition result of the adder 14 with the end bit position data ENDP generated by the second bit position table 16. The comparator 10 generates an area boundary detection flag ENDF when the addition result of the adder 14 is greater than the end bit position data ENDP generated by the second bit position table 16.

The variable length code table 13 generates a termination end code detection flag EOBF when the block termination end code (EOB) is detected in the variable length code stream STR. The depacking controller 15 controls an area number AN for reading the variable length code stream STR, and a block number BN for storing the variable length decoded coefficient value, based on the area boundary detection flag ENDF and the termination end code detection flag EOBF.

The first bit position table 18 and the stream controller 12 supply the variable length code stream STR to the variable length code table 13 until one of the area boundary detection flag ENDF and the termination end code detection flag EOBF is generated for each fixed length area. As a result, the variable length code table 13 executes the variable length decoding of the variable length code stream STR. The first bit position table 18 stores the bit position data STRP in every fixed length area when one of the area boundary detection flag ENDF and the termination end code detection flag EOBF is generated.

In depacking, the bit length calculator 19a calculates the bit length of the variable length code stream STR remaining in the fixed length area after suspending the variable length decoding. The concrete operation of the decoder 1a in depacking will be described later. When the bit length of the variable length code stream STR left in the fixed length area is calculated, a process of subtracting the suspended bit position from the end bit position of the fixed length area is required.

Therefore, it is assumed that the suspended bit position of variable length decoding is "w_bitPtr (wire [11:0] w_bitPtr)", the end bit position of the fixed length area is "w_bitEndPtr (wire [11:0] w_bitEndPtr)", and the bit length left in the fixed length area after suspension of the variable length decoding is "bitLength (output [11:0] bitLength)", the logical expression of hardware description language (HDL) in the register transfer level (RTL) is represented by the following equation (1).

output [11:0]bitLength;

wire [11:0]w_bitPtr;

wire [11:0]w_bitEndPtr;

assign bitLength=w_bitEndPtr−w_bitPtr;    (1)

In the equation (1), the symbol "[11:0]" refers to a data width having 12 bits from zero to 11 bits. By executing logic synthesis to the HDL logic expression shown in equation (1), a common 12 bits subtractor (not illustrated) including 12 inverters and 12 full adders (FA) is designed.

In the equation (1), a subtraction process can be replaced by a bit inversion and an addition of logic value "1" because the subtraction process is executed by utilizing two's complement expression. That is, the equation (1) is replaced by the following equation (2).

bitLength[11:0]=w_bitEndPtr[11:0]+~w_bitPtr[11:0]+12'h1;    (2)

In the equation (2), the symbol "~" refers to a bit inversion. With respect to a DV format, such as the DVC format, the maximum bit length of the variable length code is 16 bits. When the variable length code stream STR is combined in depacking, the variable length code stream STR, to be combined, is a variable length code stream STR less than a variable length code.

Therefore, the bit length of the variable length code stream STR to be combined is limited to less than or equal to 15 bits in depacking. Since the bit length $(15)_{10}$ is expressed by $(1111)_2$ as binary numbers, the bit length calculated by the bit length calculator 19a is less than or equal to 15 bits. Since the upper eight bits are unnecessary in the equation (2), the equation (2) can be replaced by the following equation (3).

bitLength[3:0]=w_bitEndPtr[3:0]+~w_bitPtr[3:0]+4'h1;    (3)

With respect to a DV format, such as the DVC format, the bit length of each luminance area shown in FIG. 2 to FIG. 5 is 112 bits, and the bit length of each chrominance area shown in FIG. 6 and FIG. 7 is 80 bits. Therefore, the end bit position of each fixed length area is a multiple of 16 bits. When the multiple of 16 bits is expressed by binary numbers, the lower four bits are zero. The equation (3) can be replaced by the following equation (4).

bitLength[3:0]=~w_bitPtr[3:0]+4'h1;    (4)

As a result, the equation (1) can be replaced by the following equation (5).

output [3:0] bitLength;

wire [11:0] w_bitPtr;

assign bitLength=~w_bitPtr[3:0]+4'h1;    (5)

Figure 8:
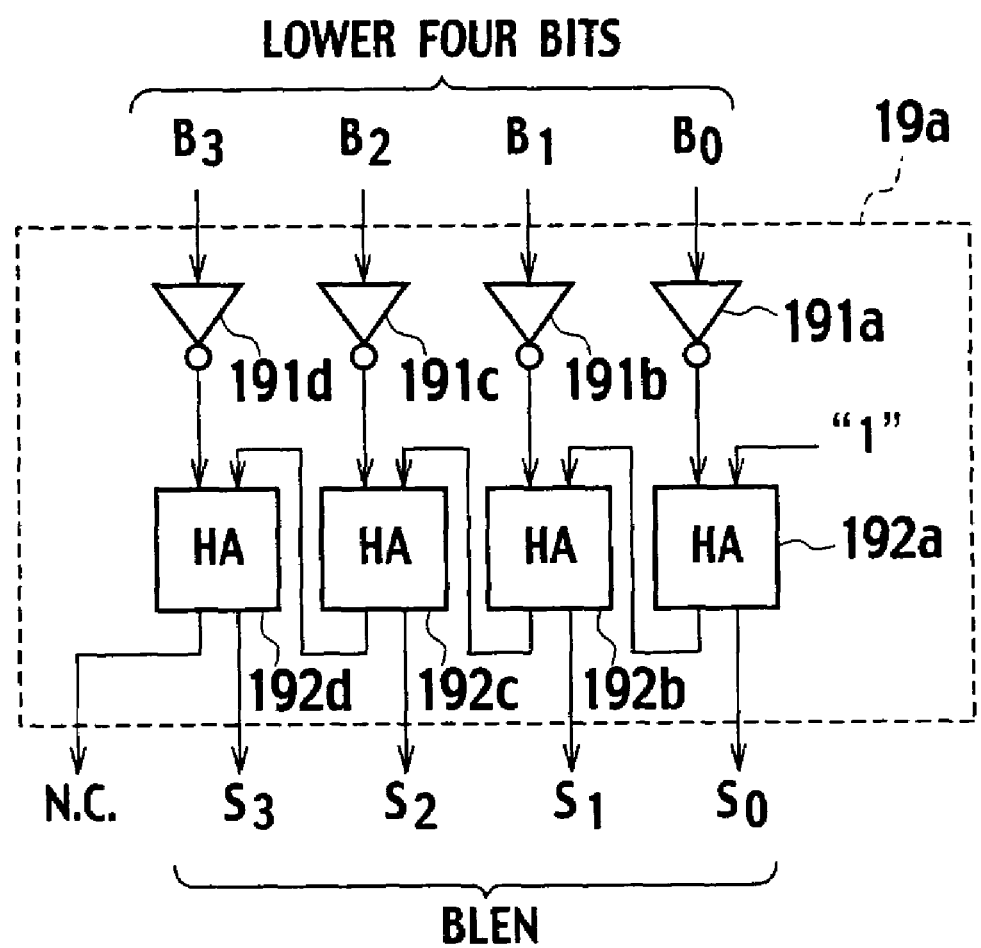
FIG. 8 is a circuit diagram showing a bit length calculator according to the embodiment of the present invention.

When the HDL logic expression shown in the equation (5) is subjected to logic synthesis, a bit length calculator 19a, shown in FIG. 8, is designed.

The bit length calculator 19a, shown in FIG. 8, includes first to fourth inverters 191a to 191d, and first to fourth half adders (HA) 192a to 192d. The first inverter 191a inverts the least significant bit (LSB) $B_0$ of the bit position data STRP. The second inverter 191b inverts the second bit $B_1$ of the bit position data STRP. The third inverter 191c inverts the third bit $B_2$ of the bit position data STRP. The fourth inverter 191d inverts the fourth bit $B_3$ of the bit position data STRP.

The first HA 192a adds a logic value "1" to an output value of the first inverter 191a. The second HA 192b adds a carry value of the first HA 192a to an output value of the second inverter 191b. The third HA 192c adds a carry value of the second HA 192b to an output value of the third inverter 191c. The fourth HA 192d adds a carry value of the third HA 192c to an output value of the fourth inverter 191d. The output value $S_0$ of the first HA 192a, the output value $S_1$ of the second HA 192b, the output value $S_2$ of the third HA 192c, and the output value $S_3$ of the fourth HA 192d are supplied to the stream controller 12, shown in FIG. 1, as the bit length data BLEN.

When the bit length calculator 19a and a common 12 bits subtractor are compared, the number of adders is reduced from twelve to four; the kind of adders is changed from FA to HA. Therefore, the circuit scale of the bit length calculator 19a is less than ⅓ compared with the common 12 bits subtractor.

Next, an operation of the decoder 1a according to the embodiment of the present invention will be described by referring to a flow chart shown in FIG. 9. It will be explained that the decoder 1a executes the depacking and the variable length decoding of the variable length code stream of a sync-block shown in FIG. 2 to FIG. 7. In this case, the second bit position table 18 shown in FIG. 1 previously stores each end bit position data ENDP of the first luminance area AR1, the second luminance area AR2, the third luminance area AR3, the fourth luminance area AR4, the first chrominance area AR5, and the second chrominance area AR6, as shown in FIG. 10(a).

Figure 9:
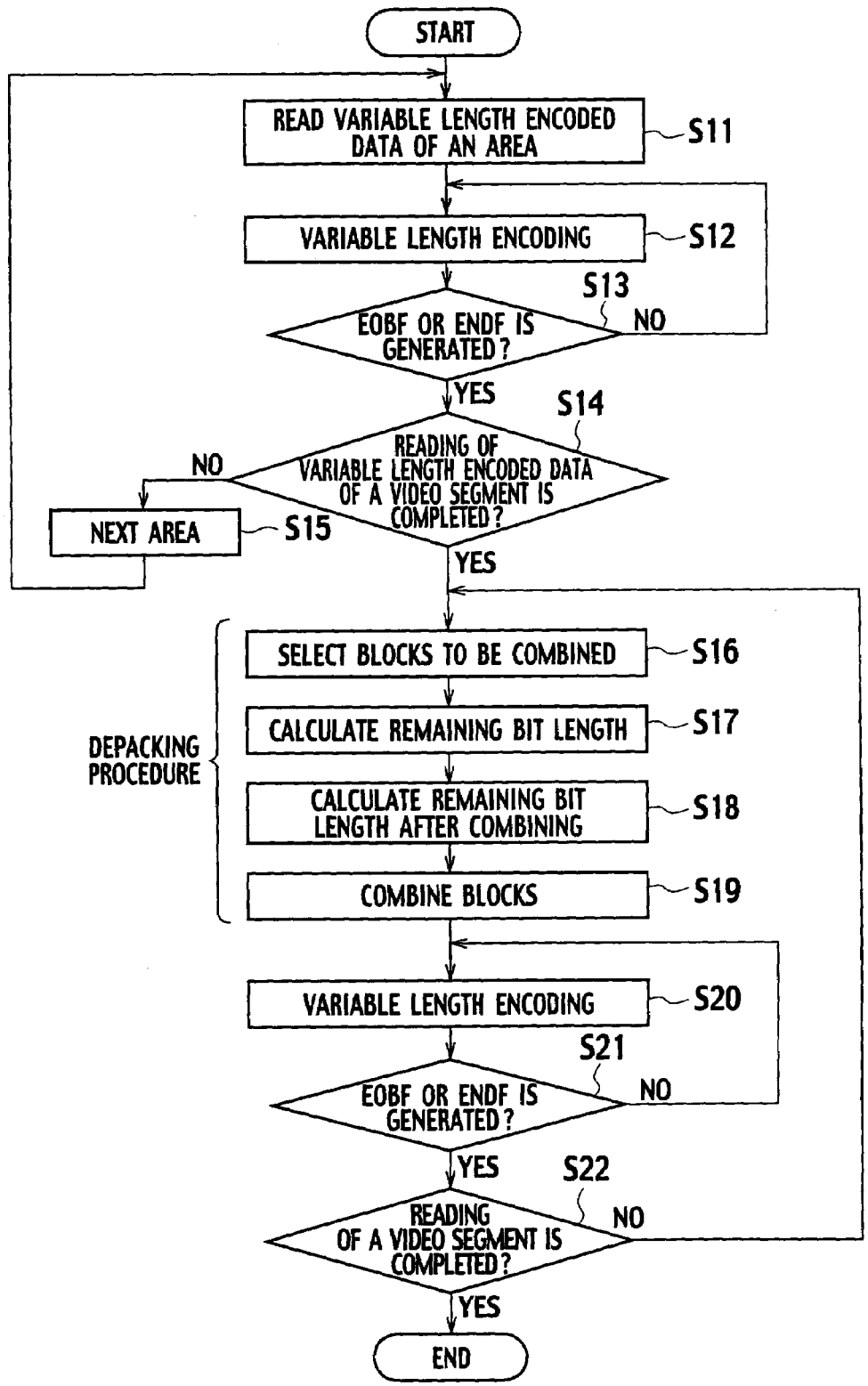
FIG. 9 is a flow chart showing an operation example of the decoder according to the embodiment of the present invention.
Figures 10, 11:
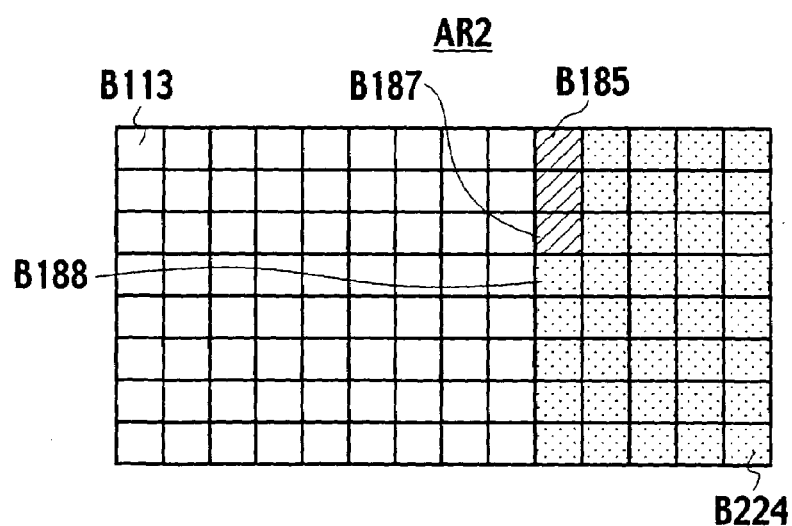
FIG. 10 is a table for explaining a function of the decoder according to the embodiment of the present invention.
FIG. 11 is a schematic diagram for explaining an operation of the decoder in depacking according to the embodiment of the present invention.

In step S11 of FIG. 9, the stream controller 12, shown in FIG. 1, via the first memory controller 11, reads out the variable length code stream STR of a fixed length area from the input memory 2. For example, variable length code stream STR corresponding to the first luminance area AR1, shown in FIG. 2, is supplied to the stream controller 12. The read variable length code stream STR is stored in the stream controller 12. The variable length code stream STR stored in the stream controller 12 is supplied to the variable length code table 13 shown in FIG. 1 in accordance with the stream control data CTP from the first bit position table 18.

In step S12, the variable length code table 13 supplies the bit length data LEN of the read variable length code stream STR to the adder 14.

In steps S12 and S13, the variable length decoding of each variable length code in the variable length code stream STR is repeated until the area boundary detection flag ENDF or the termination end code detection flag EOBF is generated. When the area boundary detection flag ENDF or the termination end code detection flag EOBF is generated, the procedure goes to step S14.

Figure 3:
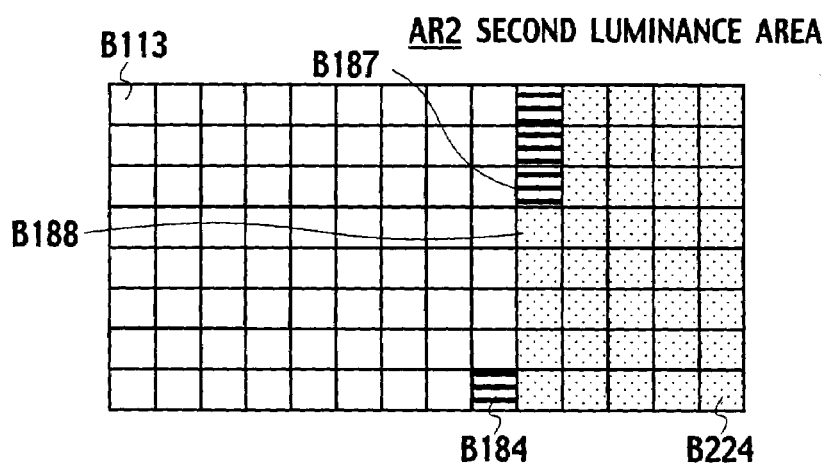
FIG. 3 is a schematic diagram showing a data arrangement example of a second luminance area according to the embodiment of the present invention.
Figure 4:
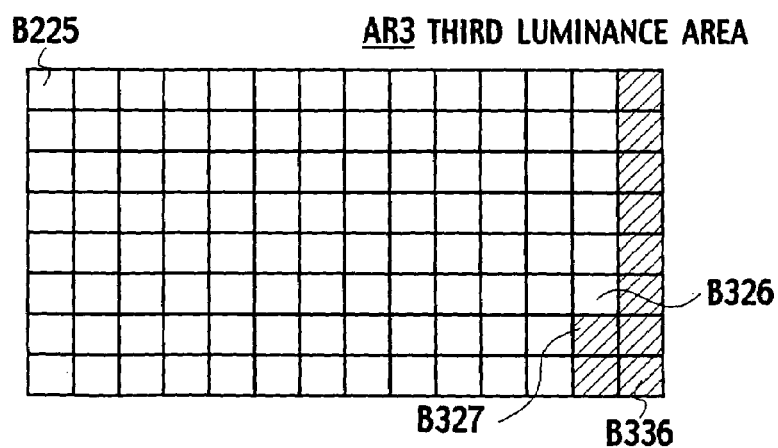
FIG. 4 is a schematic diagram showing a data arrangement example of a third luminance area according to the embodiment of the present invention.
Figure 5:
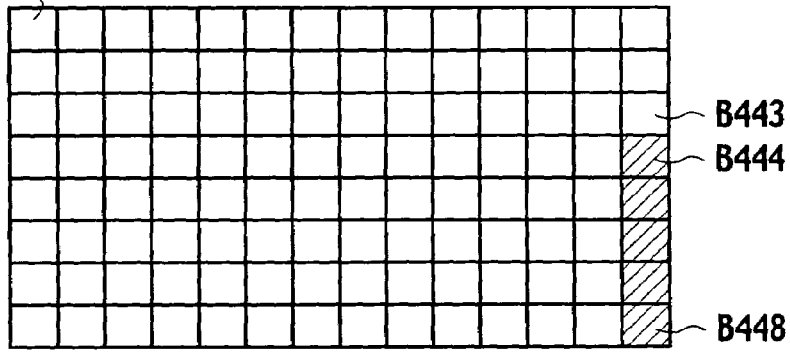
FIG. 5 is a schematic diagram showing a data arrangement example of a fourth luminance area according to the embodiment of the present invention.

In the first luminance area AR1 shown in FIG. 2, variable length code stream, except for bit B110 to bit B112 is stored in another fixed length area by packing, e.g. the second luminance area AR2 shown in FIG. 3. The comparator 10, shown in FIG. 1, generates the area boundary detection flag ENDF, as shown in FIG. 10(c). The variable length decoding for the first luminance area AR1 is suspended at bit B109. As a result, the first bit position table 18 stores $(109)_{10}$ as the bit position data STRP of the bit B109, as shown in FIG. 10(b).

In step S14, it is determined whether the reading of the variable length code stream STR corresponding to the fixed length area of a video segment has been completed. When it is determined that reading of the variable length code stream STR corresponding to the fixed length area of a video segment has been completed, the procedure goes to step S16. When it is determined that reading of the variable length code stream STR, corresponding to the fixed length area of a video segment, has not been completed, the procedure goes to step S15.

In step S15, the reading area number AN from the depacking controller 15, shown in FIG. 1, increases. The area number AN is increased, and the procedure returns to step S11. The second luminance area AR2 shown in FIG. 3 is read out.

In the second luminance area AR2, the variable length code table 13 determines that the bit from B184 to the bit B187 is the EOB, and generates the termination end code detection flag EOBF, as shown in FIG. 10(d). The EOB has a fixed bit length of four bits, for instance. As a result, the variable length decoding of the second luminance area AR2 is suspended at the bit B187. When the variable length decoding of the second luminance area AR2 is suspended, the first bit position table 18 stores $(187)_{10}$ as the bit position data STRP of the bit B187, as shown in FIG. 10(b). Similarly, the procedure from step S11 to step S15 is repeated.

The first bit position table 18 stores $(326)_{10}$ as the data STRP of the third luminance area AR3, stores $(443)_{10}$ as the data STRP of the fourth luminance area AR4, stores $(509)_{10}$ as the data STRP of the first chrominance area AR5, and stores $(594)_{10}$ as the data STRP of the second chrominance area AR6, as shown in FIG. 10(b).

In step S16, the depacking controller 15 selects two fixed length areas to be combined from the first luminance area AR1 to the second chrominance area AR6. The depacking controller 15 selects a fixed length area having the termination end code detection flag EOBF of logic value "1", and a fixed length area having the area boundary detection flag ENDF of logic value "1".

It is assumed that the first luminance area and the second luminance area AR2 are selected. The depacking controller 15 controls the stream controller 12 by utilizing the first bit position table 18 so as to combine a variable length code stream STR in the fixed length area having the termination end code detection flag EOBF of logic value "1" with a variable length code stream STR in the fixed length area having the area boundary detection flag ENDF of logic value "1".

In step S17, the bit length calculator 19a calculates the bit length BLEN of the remaining variable length code stream STR left in a fixed length area having the area boundary detection flag ENDF of logic value "1", i.e., in the first luminance area AR1.

As shown in FIG. 10(a) and FIG. 10(b), the data STRP of the first luminance area AR1 is $(109)_{10}$. The $(109)_{10}$ is expressed by $(1101101)_2$ in binary form. The lower four bits of the (1101101)2, i.e., $(1101)_2$ are supplied to the bit length calculator 19a shown in FIG. 8.

The first to fourth inverters 191a to 191d invert the $(1101)_2$, and generate $(0010)_2$. The first to fourth HA 192a to 192d add logic value $(1)_2$ to the output value $(0010)_2$ of the first to fourth inverters 191a to 191d. As a result, $(0011)_2$ is calculated. The $(0011)_2$ is expressed by $(3)_{10}$ as decimal number.

The value $(3)_{10}$ is equal to a subtraction result of "data ENDP $(112)_{10}$"–"data STRP $(109)_{10}$". As described above, the bit length calculator 19a calculates the bit length BLEN of the remaining variable length code stream STR left in the first luminance area AR1, based on the lower four bits of the data STRP.

In step S18, the stream controller 12 calculates the bit length of the remaining variable length code stream STR left in a fixed length area, after the combining operation. In an example shown in FIG. 11, the bit length of the remaining variable length code stream STR left in the fixed length area after the combining operation is calculated by subtracting the bit length BLEN $(3)_{10}$, calculated by the bit length calculator 19a, from the bit position $(187)_{10}$ of bit B187. In this case, the remaining variable length code stream STR after the combining operation is $(184)_{10}$.

In step S19, the stream controller 12 combines the two variable length code streams selected in step S16.

In step S20, the stream controller 12 supplies the combined variable length code stream STR to the variable length code table 13. In an example shown in FIG. 11, the stream controller 12 supplies the combined variable length code stream STR, after bit B185, to the variable length code table 13 in accordance with the remaining bit length $(184)_{10}$ calculated in step S18. As a result, the combined variable length code stream STR is decoded by the variable length code table 13. The variable length decoding of the combined variable length code stream STR is continued until the termination end code detection flag EOBF or the area boundary detection flag ENDF is generated in step S21. When the termination end code detection flag EOBF or the area boundary detection flag ENDF is generated, the procedure goes to step S22.

In step S22, each bit position data STRP of two fixed length areas is updated. When the area boundary detection flag ENDF is generated in step S21, the ENDF is recorded, as shown in FIG. 10(c). When the termination end code detection flag EOBF is generated in step S21, the EOBF is recorded, as shown in FIG. 10(d).

In step S22, when it is determined that the variable length decoding for the variable length code stream STR of a video segment has not been completed, the procedure returns to step S16. When it is determined that the variable length decoding for the variable length code stream STR of a video segment has been completed, the procedure is suspended. Furthermore, the variable length code stream STR of a new video segment is stored in the input memory 2 shown in FIG. 1, and the procedure is resumed from step S11.

As described above, it is possible to reduce the process time required for step S17 shown in FIG. 9 by less than ⅓ of the currently required time because the circuit scale of the bit length calculator 19a is educed to less than ⅓ compared with a common 12 bits subtractor. The entire number of gates of the second bit position table 16, the selector 17, the first bit position table 18, and the bit length calculator 19a is 7965, as shown in table 1(b). When a common subtractor is used instead of the bit length calculator 19a, the number of gates is 8650, as shown in table 1(a). That is, the number of gates is reduced by about 10%.

TABLE 1

|  | Number of gates | Maximum delay time |
|---|---|---|
| (a) Comparison example | 8650 | 3.02 [ns] |
| (b) Embodiment of the present invention | 7965 | 2.60 [ns] |

In the comparison example shown in table 1(a), the maximum delay time is 3.02 [ns] when 0.13 [μm] process is utilized. When the bit length calculator 19a shown in FIG. 8 is used, the maximum delay time is 2.60 [ns]. That is, the maximum delay time is reduced by about 14%.

Since the bit width of the bit length data BLEN generated by the bit length calculator 19a is four bits, it is possible to decrease the load of the stream controller 12 of executing the process of step S18 shown in FIG. 9. Accordingly, it is possible to provide the decoder 1a that is capable of executing the depacking by one step, of reducing the load of a memory access, of operating at a high speed, and of having a small circuit scale.

TABLE 2

|  | Depacking process | Memory access load | Operational speed | Circuit scale |
|---|---|---|---|---|
| General technique | Two steps | — | — | — |
| Japanese Patent Application Laid-open No. H8-275162 | One step | Large | Low | Large |
| Japanese Patent Application Laid-open No. 2001-296243 | One step | Small | Low | Large |
| Embodiment of the present invention | One step | Small | High | Small |

First Modification

Figure 12:
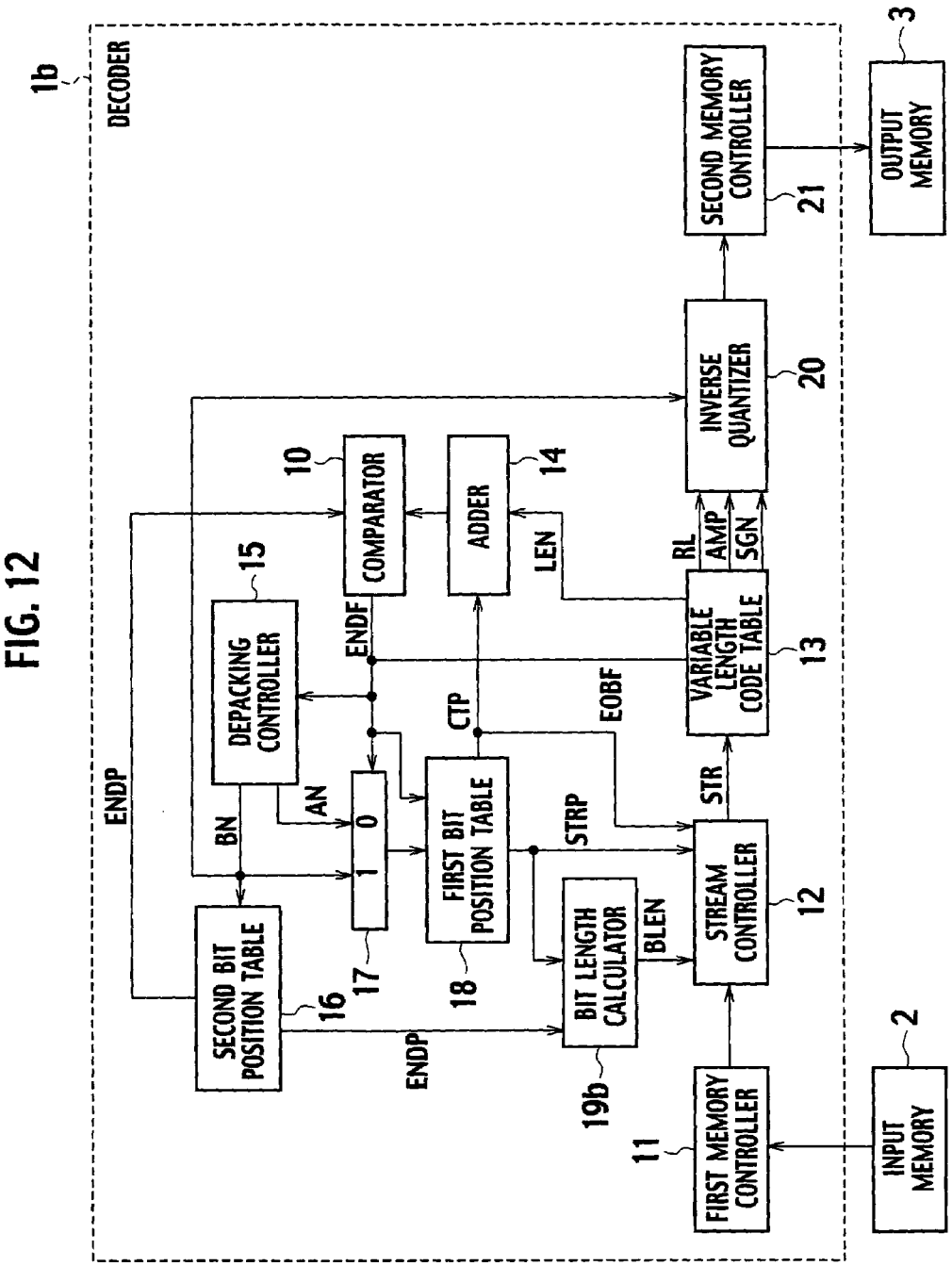
FIG. 12 is a block diagram showing a decoder according to a first modification of the embodiment of the present invention.
Figure 13:
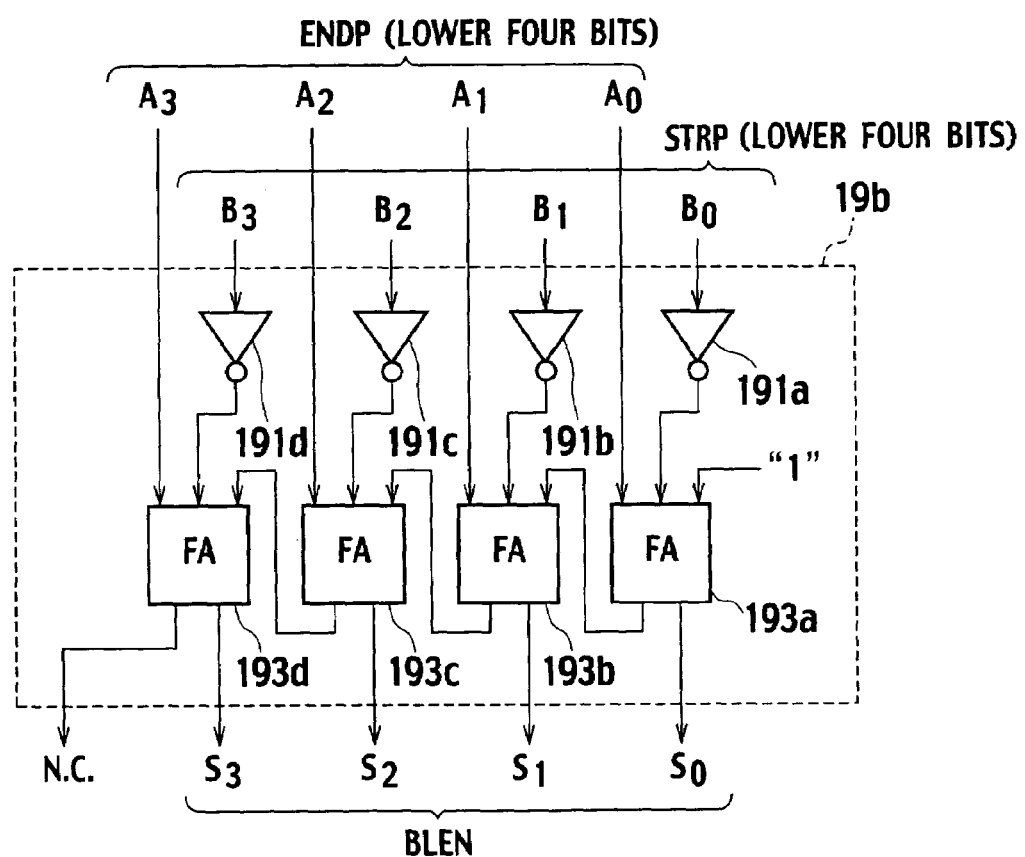
FIG. 13 is a circuit diagram showing a bit length calculator according to the first modification of the embodiment of the present invention.

As shown in FIG. 12, a decoder 1b according to a first modification of the embodiment of the present invention includes a bit length calculator 19b having an input connected to an output of the second bit position table 16. As shown in FIG. 13, the bit length calculator 19b calculates the bit length BLEN by utilizing the lower four bits from $B_0$ to $B_3$ of the data STRP and the lower four bits from $A_0$ to $A_3$ of the data ENDP.

The bit length calculator 19b includes first to fourth inverters 191a to 191d, and first to fourth FA 193a to 193d. The first FA193a adds a logic value "1", an output value of the first inverter 191a, and the LSB $A_0$ of the data ENDP. The second FA 193b adds a carry value of the first FA 193a, an output value of the second inverter 191b, and the second bit $A_1$ of the data ENDP. The third FA 193c adds a carry value of the second FA 193b, an output value of the third inverter 191c, and the third bit $A_2$ of the data ENDP. The fourth FA 193d adds a carry value of the third FA 193c, an output value of the fourth inverter 191d, and the fourth bit $A_3$ of the data ENDP. The output value $S_0$ of the first FA 193a, the output value $S_1$ of the second FA 193b, the output value $S_2$ of the third FA 193c, and the output value $S_3$ of the fourth FA 193d are supplied to the stream controller 12, as the bit length data BLEN.

It is possible apply the bit-length calculator 19b to the variable length code having the maximum length of 16 bits when the end bit position of each fixed length area is not a multiple of 16 bits.

Second Modification

Figure 14:
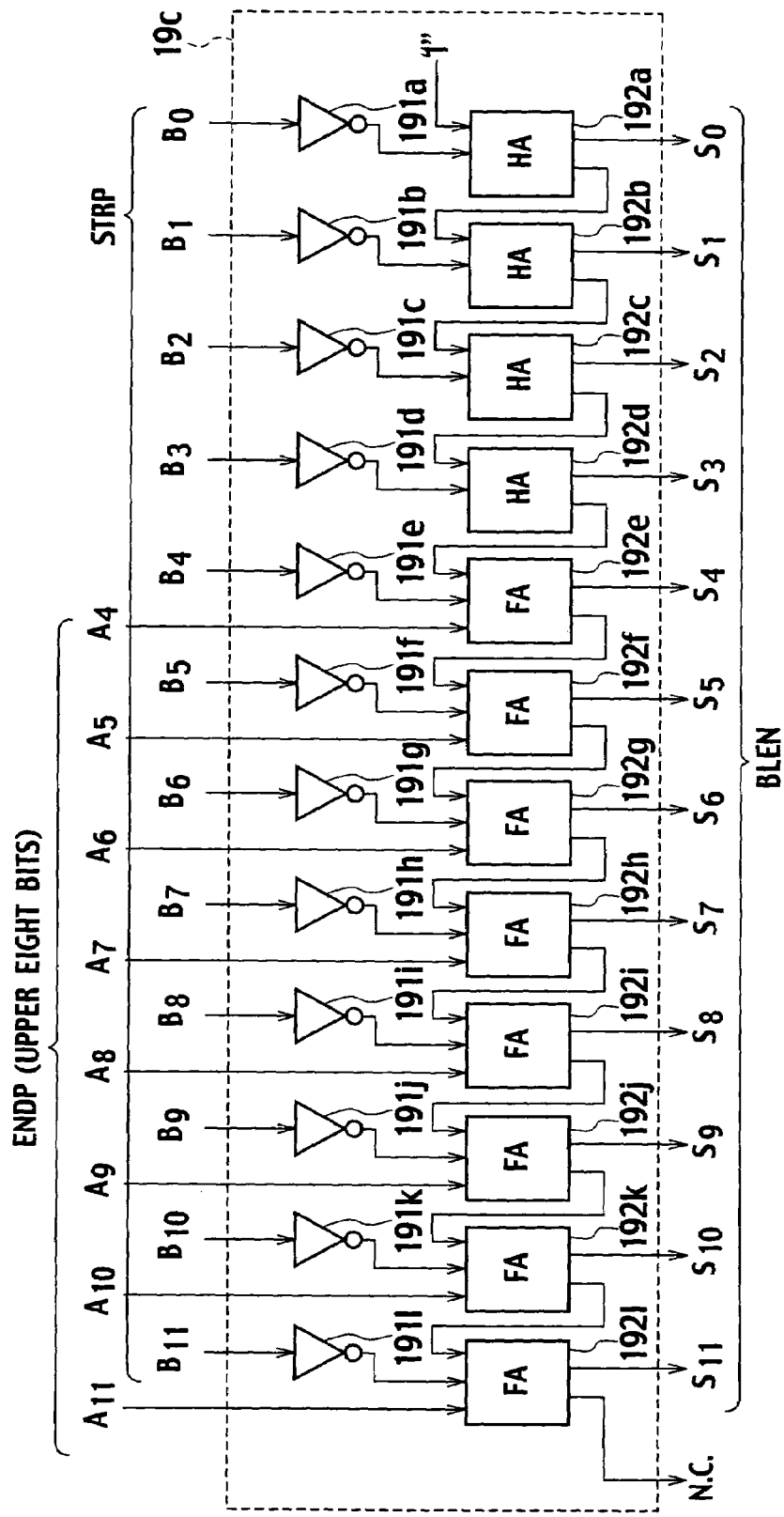
FIG. 14 is a circuit diagram showing a bit length calculator according to a second modification of the embodiment of the present invention.

As shown in FIG. 14, the bit length calculator 19c receives all bits of the data STRP, as a decoder according to the second modification of the embodiment of the present invention. That is, the equation (2) can be replaced by the following equation (6) because the lower four bits of the data ENDP.

$$\text{bitLength}[11:0] = \{w\_\text{bitEnd}Ptr[11:4], 4'b0000\} + \sim w\_\text{bit}Ptr[11:0] + 12'h1; \quad (6)$$

As shown in FIG. 14, the bit length calculator 19c includes first to twelfth inverters 191a to 191l, first to fourth HA 192a to HA 192d, and first to eighth FA 192e to 192l. The first inverter 191a inverts the least significant bit (LSB) $B_0$ of the bit position data STRP. The second inverter 191b inverts the second bit $B_1$ of the bit position data STRP. The third inverter 191c inverts the third bit $B_2$ of the bit position data STRP. The fourth inverter 191d inverts the fourth bit $B_3$ of the bit position data STRP. The fifth inverter 191e inverts the fifth bit $B_4$ of the data STRP. The sixth inverter 191f inverts the sixth bit $B_5$ of the data STRP. The seventh inverter 191g inverts the seventh bit $B_6$ of the data STRP. The eighth inverter 191h inverts the eighth bit $B_7$ of the data STRP. The ninth inverter 191i inverts the ninth bit $B_8$ of the data STRP. The tenth inverter 191j inverts the tenth bit $B_9$ of the data STRP. The eleventh inverter 191k inverts the eleventh bit $B_{10}$ of the data STRP. The twelfth inverter 191l inverts the twelfth bit (MSB) $B_{11}$ of the data STRP.

The first FA 192e adds a carry value of the fourth HA 192d, an output value of the fifth inverter 191e, and the fifth bit $A_4$ of the data ENDP. The second FA 192f adds a carry value of the first FA 192e, an output value of the sixth inverter 191f, and the sixth bit $A_5$ of the data ENDP. The third FA 192g adds a carry value of the second FA 192f, an output value of the seventh inverter 191g, and the seventh bit $A_6$ of the data ENDP. The fourth FA 192h adds a carry value of the third FA 192g, an output value of the eighth inverter 191h, and the eighth bit $A_7$ of the data ENDP. The fifth FA 192i adds a carry value of the fourth FA 192h, an output value of the ninth inverter 191i, and the ninth bit $A_8$ of the data ENDP. The sixth FA 192j adds a carry value of the fifth FA 192i, an output value of the tenth inverter 191j, and the tenth bit $A_9$ of the data ENDP. The seventh FA 192k adds a carry value of the sixth FA 192j, an output value of the eleventh inverter 191k, and the eleventh bit $A_{10}$ of the data ENDP. The eighth FA 192l adds a carry value of the seventh FA 192k, an output value of the twelfth inverter 191l, and the twelfth bit $A_{11}$ of the data ENDP.

It is possible to apply the bit length calculator 19c when the end bit position of each fixed length area is a multiple of 16 bits, and the maximum length of the variable length code is not 16 bits.

Other Embodiments

Various modifications will become possible for those skilled in the art after receiving the teachings of the present disclosure without departing from the scope thereof.

In the aforementioned embodiment, the description has been given with regard to an example in which the decoder executes the depacking and the variable length decoding of picture data that conforms variable length encoding and packing of the DVC format. However, in addition to the DVC format, the decoder may be applied to the other DV formats. When the maximum bit length of the variable length code is not 16 bits, the bit length calculator calculates the bit length by utilizing the lower N bits of the bit position data, where N refers to the number of bits capable of representing a maximum bit length–1 of a variable length code of the variable length code stream. When the maximum bit length of the variable length code is $(16)_{10}$ bits, the "the number of bits capable of representing a maximum bit length–1 of a variable length code" refers to a bit length required for representing $16-1=(15)_{10}$ in binary form. Since the $(15)_{10}$ is expressed by $(1111)_2$ in binary form, the "the number of bits capable of representing a maximum bit length–1 of a variable length code" is four bits.

What is claimed is:

1. A decoder configured to receive a variable length code stream packed in a fixed length area, and to execute variable length decoding and depacking of the variable length code stream, comprising:
    a first bit position table configured to store bit position data of the variable length code stream at a point where the variable length decoding is suspended; and
    a bit length calculator configured to calculate a bit length of variable length code stream remaining in the fixed length area after suspending the variable length decoding in the depacking, based on the bit position data.

2. The decoder of claim 1, wherein the bit length calculator calculates the bit length by utilizing the lower N bits of the bit position data, where N refers to the number of bits capable of representing a maximum bit length –1 of a variable length code of the variable length code stream.

3. The decoder of claim 1, wherein the bit length calculator calculates the bit length by utilizing the lower four bits of the bit position data.

4. The decoder of claim 3, wherein the bit length calculator comprises:
    first to fourth inverters configured to invert first to fourth bits of the bit position data, respectively;
    a first half adder configured to add a logic value "1" to an output value of the first inverter;
    a second half adder configured to add a carry value of the first half adder to an output value of the second inverter;
    a third half adder configured to add a carry value of the second half adder to an output value of the third inverter; and
    a fourth half adder configured to add a carry value of the third half adder to an output value of the fourth inverter.

5. The decoder of claim 1, further comprising a second bit position table configured to store end bit position data of the fixed length area.

6. The decoder of claim 5, wherein the bit length calculator calculates the bit length by utilizing part of the bits of the bit position data and part of the bits of the end bit position data.

7. The decoder of claim 6, wherein the bit length calculator calculates the bit length by utilizing the lower four bits of the bit position data and the lower four bits of the end bit position data.

8. The decoder of claim 7, wherein the bit length calculator comprises:
    first to fourth inverters configured to invert first to fourth bits of the bit position data, respectively;
    a first full adder configured to add a logic value "1", an output value of the first inverter, and the first bit of the end bit position data;
    a second full adder configured to add a carry value of the first full adder, an output value of the second inverter, and the second bit of the end bit position data;
    a third full adder configured to add a carry value of the second full adder, an output value of the third inverter, and the third bit of the end bit position data; and
    a fourth full adder configured to add a carry value of the third full adder, an output value of the fourth inverter, and the fourth bit of the end bit position data.

9. The decoder of claim 1, wherein the bit length calculator calculates the bit length by utilizing all bits of the bit position data and part of the bits of the end bit position data.

10. The decoder of claim 9, wherein the upper eight bits of the end bit position data are utilized as the part of the bits of the end bit position data.

11. The decoder of claim 10, wherein the bit length calculator comprises:
    first to twelfth inverters configured to invert first to twelfth bits of the bit position data, respectively;
    a first half adder configured to add a logic value "1" to an output value of the first inverter;
    a second half adder configured to add a carry value of the first half adder to an output value of the second inverter;
    a third half adder configured to add a carry value of the second half adder to an output value of the third inverter;
    a fourth half adder configured to add a carry value of the third half adder to an output value of the fourth inverter;
    a first full adder configured to add a carry value of the fourth half adder, an output value of the fifth inverter, and the fifth bit of the end bit position data;
    a second full adder configured to add a carry value of the first full adder, an output value of the sixth inverter, and the sixth bit of the end bit position data;
    a third full adder configured to add a carry value of the second full adder, an output value of the seventh inverter, and the seventh bit of the end bit position data;
    a fourth full adder configured to add a carry value of the third full adder, an output value of the eighth inverter, and the eighth bit of the end bit position data;
    a fifth full adder configured to add a carry value of the fourth full adder, an output value of the ninth inverter, and the ninth bit of the end bit position data;
    a sixth full adder configured to add a carry value of the fifth full adder, an output value of the tenth inverter, and the tenth bit of the end bit position data;
    a seventh full adder configured to add a carry value of the sixth full adder, an output value of the eleventh inverter, and the eleventh bit of the end bit position data; and
    an eighth full adder configured to add a carry value of the seventh full adder, an output value of the twelfth inverter, and the twelfth bit of the end bit position data.

12. The decoder of claim 5, further comprising:
    a variable length code table configured to execute the variable length decoding of the variable length code stream, to generate a termination end code detection flag when a block termination end code is detected in the variable length code stream, and to generate code length data of each variable length code of the variable length code stream;
    a stream controller configured to transmit the variable length code stream to the variable length code table in accordance with stream control data generated by the first bit position table;
    an adder configured to add the stream control data to the code length data; and a comparator configured to compare an addition result of the adder with the end bit position data, and to generate an area boundary detection flag when the addition result is greater than the end bit position data.

13. The decoder of claim 12, wherein the stream controller supplies the variable length code stream of each fixed length area to the variable length code table until one of the area boundary detection flag and the termination end code detection flag is generated.

14. The decoder of claim 13, wherein the first bit position table stores the bit position data when one of the area boundary detection flag and the termination end code detection flag is generated.

15. The decoder of claim 13, further comprising a depacking controller configured to select the fixed length area that the termination end code detection flag is generated, and the fixed length area that the area boundary detection flag is generated, so as to combine the variable length code stream in the depacking.

16. The decoder of claim 15, wherein the bit length calculator calculates the bit length of the variable length code stream remaining in a fixed length area that the area boundary detection flag is generated.

17. A decoding method for executing variable length decoding and depacking of a variable length code stream packed in a fixed length area, comprising:

storing bit position data of the variable length code stream at a point where the variable length decoding is suspended; and calculating a bit length of variable length code stream remaining in the fixed length area after suspending the variable length decoding in the depacking, based on the bit position data.

18. The decoding method of claim 17, wherein the bit length is calculated by utilizing the lower N bits of the bit position data, where N refers to the number of bits capable of representing a maximum bit length −1 of a variable length code of the variable length code stream.

19. The decoding method of claim 17, further comprising executing the variable length decoding for each fixed length area until one of the area boundary detection flag and the termination end code detection flag is generated.

20. The decoding method of claim 17, further comprising combining the variable length code stream in the fixed length area that the termination end code detection flag is generated, and the variable length code stream in the fixed length area that the area boundary detection flag is generated, in depacking.

* * * * *